(12) United States Patent
Archambault et al.

(10) Patent No.: US 11,695,418 B2
(45) Date of Patent: Jul. 4, 2023

(54) TOPOLOGICALLY PROTECTED QUANTUM CIRCUIT WITH SUPERCONDUCTING QUBITS

(71) Applicant: ANYON SYSTEMS INC., Dorval (CA)

(72) Inventors: Chloé Archambault, Verdun (CA); Gabriel Ethier-Majcher, Montreal (CA)

(73) Assignee: ANYON SYSTEMS INC., Dorval (CA)

( * ) Notice: Subject to any disclaimer, the term of this patent is extended or adjusted under 35 U.S.C. 154(b) by 0 days.

(21) Appl. No.: 17/830,846

(22) Filed: Jun. 2, 2022

(65) Prior Publication Data

US 2022/0399890 A1    Dec. 15, 2022

Related U.S. Application Data

(60) Provisional application No. 63/196,779, filed on Jun. 4, 2021.

(51) Int. Cl.
*H03K 17/92*     (2006.01)
*G06N 10/40*     (2022.01)

(52) U.S. Cl.
CPC ............. *H03K 17/92* (2013.01); *G06N 10/40* (2022.01)

(58) Field of Classification Search
CPC ...................................................... H03K 17/92
USPC ........................................................ 327/528
See application file for complete search history.

(56) References Cited

U.S. PATENT DOCUMENTS

| | | | |
|---|---|---|---|
| 7,109,593 B2 | 9/2006 | Freedman et al. | |
| 7,518,138 B2 | 4/2009 | Freedman et al. | |
| 7,619,437 B2 | 11/2009 | Thom et al. | |
| 8,581,227 B2 | 11/2013 | Freedman et al. | |
| 9,489,634 B2 | 11/2016 | Bonderson | |
| 10,622,998 B1 * | 4/2020 | Najafi-Yazdi | H10N 60/12 |

(Continued)

OTHER PUBLICATIONS

Baselmans, J.J.A. et al., "Reversing the direction of the supercurrent in a controllable Josephson junction", Nature, vol. 397, Jan. 7, 1999.
(Continued)

*Primary Examiner* — Tomi Skibinski
(74) *Attorney, Agent, or Firm* — Norton Rose Fulbright Canada LLP

(57) ABSTRACT

There is described herein a topologically protected quantum circuit with superconducting qubits and method of operation thereof. The circuit comprises a plurality of physical superconducting qubits and a plurality of coupling devices interleaved between pairs of the physical superconducting qubits. The coupling devices comprise at least one φ-Josephson junction, wherein a Josephson phase $\varphi_0$ of the φ-Josephson junction is non-zero in a ground state, the coupling devices have a Josephson energy $E_{J\varphi}$, the physical superconducting qubits have a Josephson energy $E_{Jq}$, and the circuit operates in a topological regime when $$\frac{E_{Jq}}{2} > -E_{J\varphi}\cos\varphi_0 > \frac{E_{Jq}}{3}.$$

20 Claims, 13 Drawing Sheets

(56) References Cited

U.S. PATENT DOCUMENTS

| | | |
|---|---|---|
| 2002/0121636 A1 | 9/2002 | Amin et al. |
| 2006/0225165 A1 | 10/2006 | Maassen Van Den Brink et al. |
| 2009/0322374 A1 | 12/2009 | Przybysz |
| 2011/0018612 A1 | 1/2011 | Harris |
| 2015/0263736 A1 | 9/2015 | Herr et al. |
| 2016/0233860 A1 | 8/2016 | Naaman |
| 2017/0193388 A1 | 7/2017 | Filipp et al. |
| 2017/0212860 A1 | 7/2017 | Naaman et al. |
| 2018/0032894 A1 | 9/2018 | Epstein |
| 2018/0260732 A1 | 9/2018 | Bloom et al. |

OTHER PUBLICATIONS

Buzdin, A.I., "Proximity effects in superconductor-ferromagnet heterostructures", arXiv:cond-mat/0505583v1, May 24, 2005.
Cai, W. et al., "Observation of topological magnon insulator states in a superconducting circuit", arXiv:1901.05683v2, Sep. 3, 2019.
Cheng, M. et al., "Topological Protection of Majorana Qubits", arXiv:1112.3662v1, Dec. 15, 2011.
Cleuziou, J.-P. et al., "Carbon Nanotube Superconducting Quantum Interference Device", Nature nanotechology, vol. 1, Oct. 2006.
Gingrich, E.C. et al., "Controllable 0—Josephson junctions containing aferromagnetic spin valve", Nature physics, vol. 12, Jun. 2016.
Kato, T. et al., "Decoherence in a superconducting flux qubit with a-junction" arXiv:0708.2652v1, Aug. 20, 2007.
Ryazanov, V.V. et al., "Coupling of two superconductors through a ferromagnet: evidence for a-junction", arXiv:cond-mat/0008364v1, Aug. 24, 2000.
Shcherbakova, A.V. et al., "Fabrication and measurements of hybrid Nb/Al Josephson junctions and flux qubits with—shifters", arXiv:1405.0373v1, May 2, 2014.
Van Harlingen, D.J., "Phase-sensitive tests of the symmetry of the pairing state in the high-temperature superconductors—Evidence for dx2-y2 symmetry", Reviews of Modern Physics, vol. 67, Apr. 1995.
Zippilli et al.: "Simulating long-distance entanglement in quantum spin chains by superconducting flux qubits", arXiv:1410.5444v2, Jan. 22, 2015, pp. 1-12.
You et al.: "Encoding a qubit with Majorana modes in superconducting circuits", Scientific Reports, 4: 5535, DOI: 10.1038, Jul. 2, 2014, pp. 1-8.
Mao et al.: "Quantum Simulation of Topological Majorana Bound States and Their Universal Quantum Operations Using Charge-Qubit Arrays", arXiv:1403.4365v2, Sep. 4, 2018, pp. 1-5.
Levitov et al.: "Quantum spin chains and Majorana states in arrays of coupled qubits", arXiv:cond-mat/0108266v2, Aug. 19, 2001, pp. 1-7.
Hu et al.: "Realizing universal quantum gates with topological bases in quantum-simulated superconducting chains", npj Quantum Information (2017) 8, Mar. 6, 2017, pp. 1-6.
Dong et al.: "Signatures of topological quantum phase transitions in driven and dissipative qubit-arrays", arXiv:1604.04770v1, Apr. 16, 2016, pp. 1-10.
Backens et al.: "Emulating Majorana fermions and their braiding by Ising spin chains", arXiv:1703.08224v3, Nov. 1, 2017, pp. 1-13.
Chen et al.: "Qubit Architecture with High Coherence and Fast Tunable Coupling", Physical Review Letters 113.22, Nov. 26, 2014, pp. 1-5.
Chen: "Metrology of Quantum Control and Measurement in Superconducting Qubits", PhD Thesis, university of California, Jan. 2018, 241 p.
Geller et al.: "Tunable coupler for superconducting Xmon qubits: Perturbative nonlinear model", Physical Review A 92, 012320 (2015), American Physical Society, Jul. 17, 2015, pp. 1-9.
Mooij et al.: "Josephson Persistent-Current Qubit", Science, vol. 285, www.sciencemag.org, Aug. 13, 1999, pp. 1036-1039.
Neill et al.: "A blueprint for demonstrating quantum supremacy with superconducting qubits", arXiv:1709.06678v1, Sep. 19, 2017, 22 p.
Orlando et al.: "A Superconducting Persistent Current Qubit", arXiv:cond-mat/9908283v2, Feb. 1, 2008, pp. 1-15.
Schwarz et al.: "Gradiometric flux qubits with a tunable gap", New Journal of Physics 15 (2013) 045001, Apr. 4, 2013, pp. 1-21.
Yoshihara et al.: "Superconducting qubit-oscillator circuit beyond the ultrastrong-coupling regime", Nature Physics 13.1, 2017, pp. 1-29.
Casanova et al.: "Deep Strong Coupling Regime of the Jaynes-Cummings model", arXiv:1008.1240v3, Oct. 22, 2018, pp. 1-4.

\* cited by examiner

TOPOLOGICALLY PROTECTED QUANTUM CIRCUIT WITH SUPERCONDUCTING QUBITS

CROSS-REFERENCE TO RELATED APPLICATIONS

The present application claims the benefit of U.S. Provisional Patent Application No. 63/196,779 filed on Jun. 4, 2021, the contents of which are hereby incorporated by reference in their entirety.

TECHNICAL FIELD

The present disclosure generally relates to quantum circuits and more particularly, to topological quantum circuits using superconducting qubits.

BACKGROUND OF THE ART

Quantum computers are machines that harness the properties of quantum states, such as superposition, interference, and entanglement, to perform computations. In a quantum computer, the basic unit of memory is a quantum bit, or qubit, which can only be detected at extremely low energy levels and at temperatures close to absolute zero. A quantum computer with enough qubits has a computational power inaccessible to a classical computer, which is referred to as "quantum advantage".

Superconducting qubits are one of the most promising candidates for developing commercial quantum computers. Indeed, superconducting qubits can be fabricated using standard microfabrication techniques. Moreover, they operate in the few GHz bandwidth such that conventional microwave electronic technologies can be used to control qubits and readout the quantum states.

A significant challenge in quantum computation is the sensitivity of the quantum information to noise. The integrity of the quantum information is limited by the coherence time of the qubits and errors in the quantum gate operations which are both affected by the environmental noise.

Therefore, improvements are needed.

SUMMARY

In accordance with a first broad aspect, there is provided a topological superconducting qubit circuit comprising a plurality of physical superconducting qubits and a plurality of coupling devices interleaved between pairs of the physical superconducting qubits. The coupling devices comprise at least one φ-Josephson junction, wherein a Josephson phase $\varphi_0$ of the φ-Josephson junction is non-zero in a ground state, the coupling devices have a Josephson energy $E_{J\varphi}$, the physical superconducting qubits have a Josephson energy $E_{Jq}$, and the circuit operates in a topological regime when $$\frac{E_{Jq}}{2} > -E_{J\varphi}\cos\varphi_0 > \frac{E_{Jq}}{3}.$$

In accordance with another broad aspect, there is provided a method for operating a topological superconducting qubit circuit. The method comprises interleaving a plurality of coupling devices with a plurality of physical superconducting qubits, the coupling devices comprising at least one φ-Josephson junction, wherein a Josephson phase $\varphi_0$ of the φ-Josephson junction is non-zero in a ground state; and providing the coupling devices with a Josephson energy $E_{J\varphi}$ and the physical superconducting qubits with a Josephson energy $E_{Jq}$, such that $$\frac{E_{Jq}}{2} > -E_{J\varphi}\cos\varphi_0 > \frac{E_{Jq}}{3}$$

to induce topological protection of the circuit.

Features of the systems, devices, and methods described herein may be used in various combinations, in accordance with the embodiments described herein.

BRIEF DESCRIPTION OF THE DRAWINGS

Reference is now made to the drawings, in which.

DETAILED DESCRIPTION

The present disclosure is directed to topologically protected quantum circuits with superconducting qubits. As used herein, the expressions "topological" and "topologically protected" refer to an intrinsic protection against noise causing decoherence of qubits. The circuit architecture described herein improves the integrity of the circuit. Qubit sensitivity to noise is reduced by using topologically protected qubits. Topologically protected qubits are based on two-dimensional quasiparticles called anyons, and more specifically on non-Abelian anyons. Majorana bound states, whose quasiparticle excitations are neither bosons nor fermions, are the most studied non-Abelian anyons. To date, non-Abelian anyons have not been found in nature. As described herein, topologically protected qubits are engineered by coupling a number of physical qubits together to form a chain, to which we refer as a topological qubit. The chain can achieve a topological state such that multiple physical qubits behave as a single topologically protected qubit insensitive to certain types of noise and characterized by a longer coherence time than the individual physical qubits. In this case, the topological qubit is said to operate in a topologically protected regime.

To operate in the topologically protected regime, a qubit circuit is controlled by applying the control signals such as electrical currents and/or magnetic fluxes. Such control signals can be noisy and represent a source of noise against which the topological qubit is not necessarily protected. As a result, noise introduced by the control signals can destroy the topological state and significantly reduce the coherence time of the topological qubit. The topologically protected quantum circuit proposed herein reduces the number of control signals, thus limiting the potential noise disturbances to the coherence time of the topological qubit.

Figure 1:
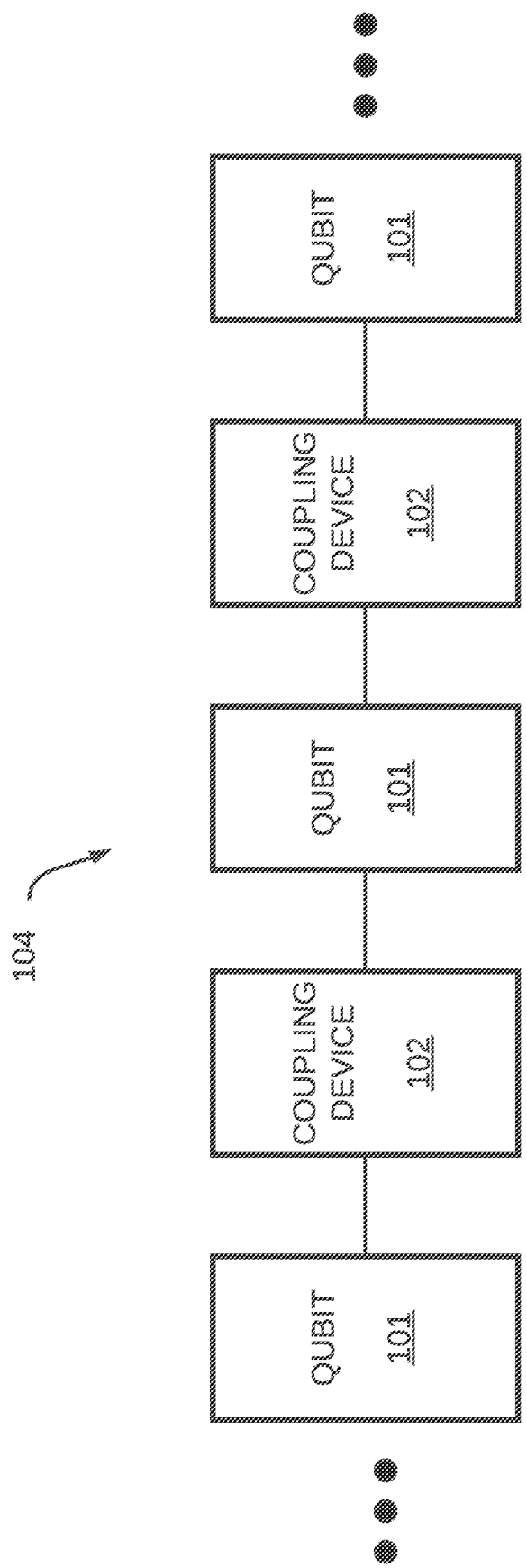
FIG. 1 is a block diagram of an embodiment of a topologically protected superconducting qubit circuit.

An example embodiment of such a circuit is illustrated in FIG. 1. A plurality of physical qubits 101 are interleaved with a plurality of coupling devices 102 to form a circuit 104. The physical qubits 101 are superconducting qubits, and may be of different types, including charge qubits, flux qubits, phase qubits, and transmon qubits. In some embodiments, the circuit 104 forms part of a topological quantum processor.

A physical qubit 101 may be coupled to one or more other physical qubits 101 through corresponding coupling devices 102, thus creating a network of physical qubits 101. All of the physical qubits 101 in the circuit 104 may be of a same configuration. Alternatively, physical qubits 101 of the circuit 104 may have different configurations. All of the coupling devices 102 in the circuit 104 may be of a same configuration. Alternatively, coupling devices 102 of the circuit 104 may have different configurations.

Figure 2B:
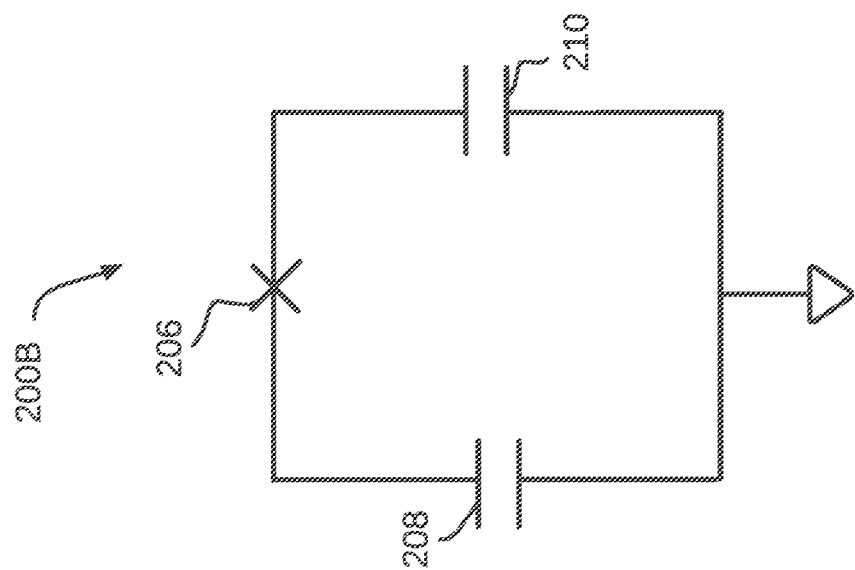
FIGS. 2A-2F are example architectures for qubits of the circuit of FIG. 1.
Figure 2A:
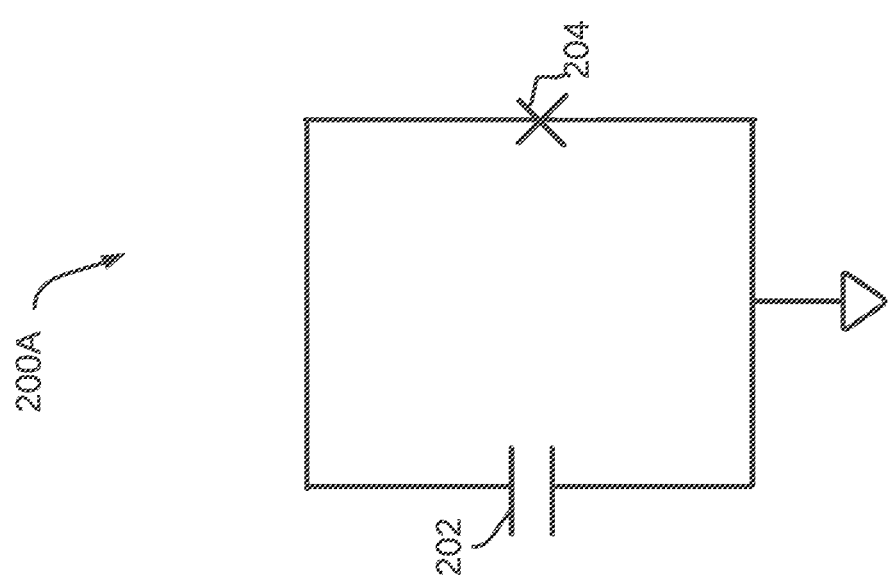
Figure 2D:
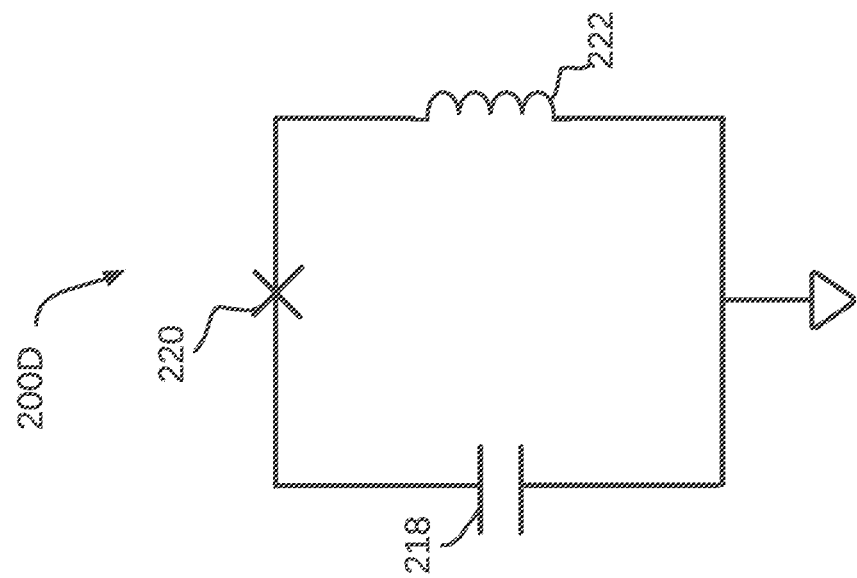
Figure 2C:
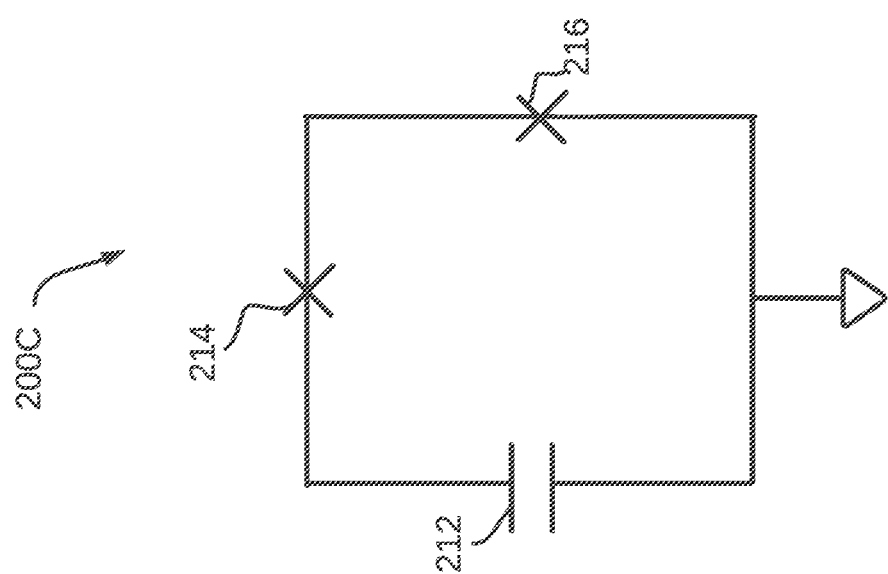
Figure 2E:
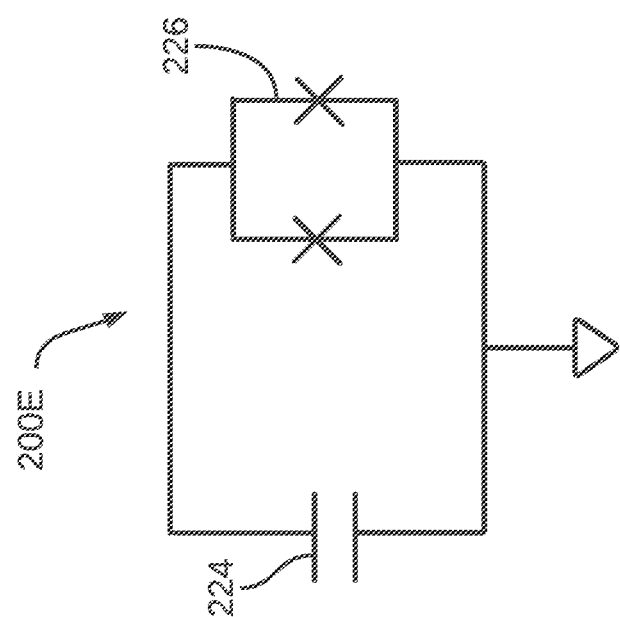
Figure 2F:
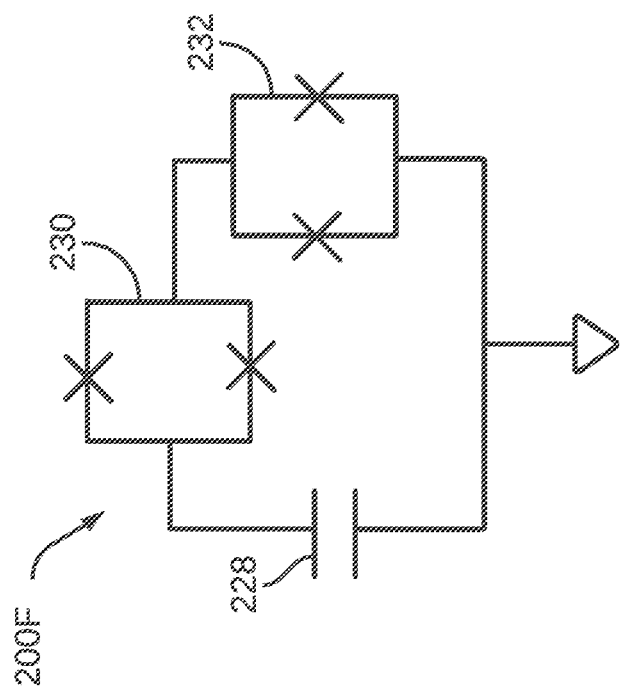

In some embodiments, the qubits 101 are composed of at least one capacitor and at least one Josephson junction connected together, for example transmon qubits. FIGS. 2A-2F illustrate example embodiments of qubit architectures. FIG. 2A illustrates a qubit 200A having a capacitor 202 and a Josephson junction 204 connected together in parallel. FIG. 2B illustrates a qubit 200B having a Josephson junction 206 connected between a first capacitor 208 and a second capacitor 210. This configuration is referred to as a differential architecture. FIG. 2C illustrates a qubit 200C having a first Josephson junction 214 connected between a capacitor 212 and a second Josephson junction 216. This configuration is referred to as a two-junction architecture. FIG. 2D illustrates a qubit 200D having a Josephson junction 220 connected between a capacitor 218 and an inductor 222. This configuration is referred to as an inductively shunted architecture. Each Josephson junction 204, 206, 214, 216, 220 may be replaced by a pair of Josephson junctions connected in parallel, referred to herein as a SQUID (superconducting quantum interference device), for tunability of the frequency of the respective qubits 200A, 200B, 200C, 200D. Examples are illustrated in FIGS. 2E-2F. FIG. 2E illustrates a qubit 200E having a SQUID 226 connected in parallel with a capacitor 224. FIG. 2F illustrates a qubit 200F having a first SQUID 230 connected between a capacitor 228 and a second SQUID 232. It will be understood that other qubit architectures may also be used to implement the qubits 101 of the circuit 104.

The coupling devices 102 comprise at least one T-Josephson junction, wherein a Josephson phase of the φ-Josephson junction is non-zero in a ground state. In order for the circuit 104 to operate in a topological regime, the coupling energy J between two qubits set by the coupling devices 102 and the energy h of the physical qubits 101 are such that |J|>|h|. In this manner, the circuit 104 may operate with only one, or in some cases zero, external control signal.

The total energy of the circuit 104 having N physical qubits 101 may be found from its Hamiltonian. Circuit 104, designed with coupling devices 102 as described herein below, has the same Hamiltonian as a 1D transversely coupled (sing spin chain, a system which, according to the Jordan-aligner transformation, can emulate Majorana bound states. In the (sing spin chain model, the Hamiltonian of a chain of N coupled physical qubits is written as:

$$H = -\Sigma_{i=1}^{N} h \sigma_i^z - \Sigma_{i=1}^{N-1} J \sigma_i^x \sigma_{i+1}^x \quad (1)$$

The $\sigma_i$ are the Pauli operators on physical qubit i. The first term relates to the energy of the physical qubits 101. The second term represents the energy of the coupling between two physical qubits 101. The coupling is said to be of ferromagnetic type for J>0 and antiferromagnetic type for J<0. A phase transition from a non-topological phase to a topological phase occurs when the coupling energy becomes larger than the qubit energy. In other words, the condition for achieving topological protection is |J|>|h|. When this condition is met, we refer to the circuit 104 as having "deep strong coupling". A circuit having deep strong coupling is said to operate in a topologically protected regime.

Figure 3A:
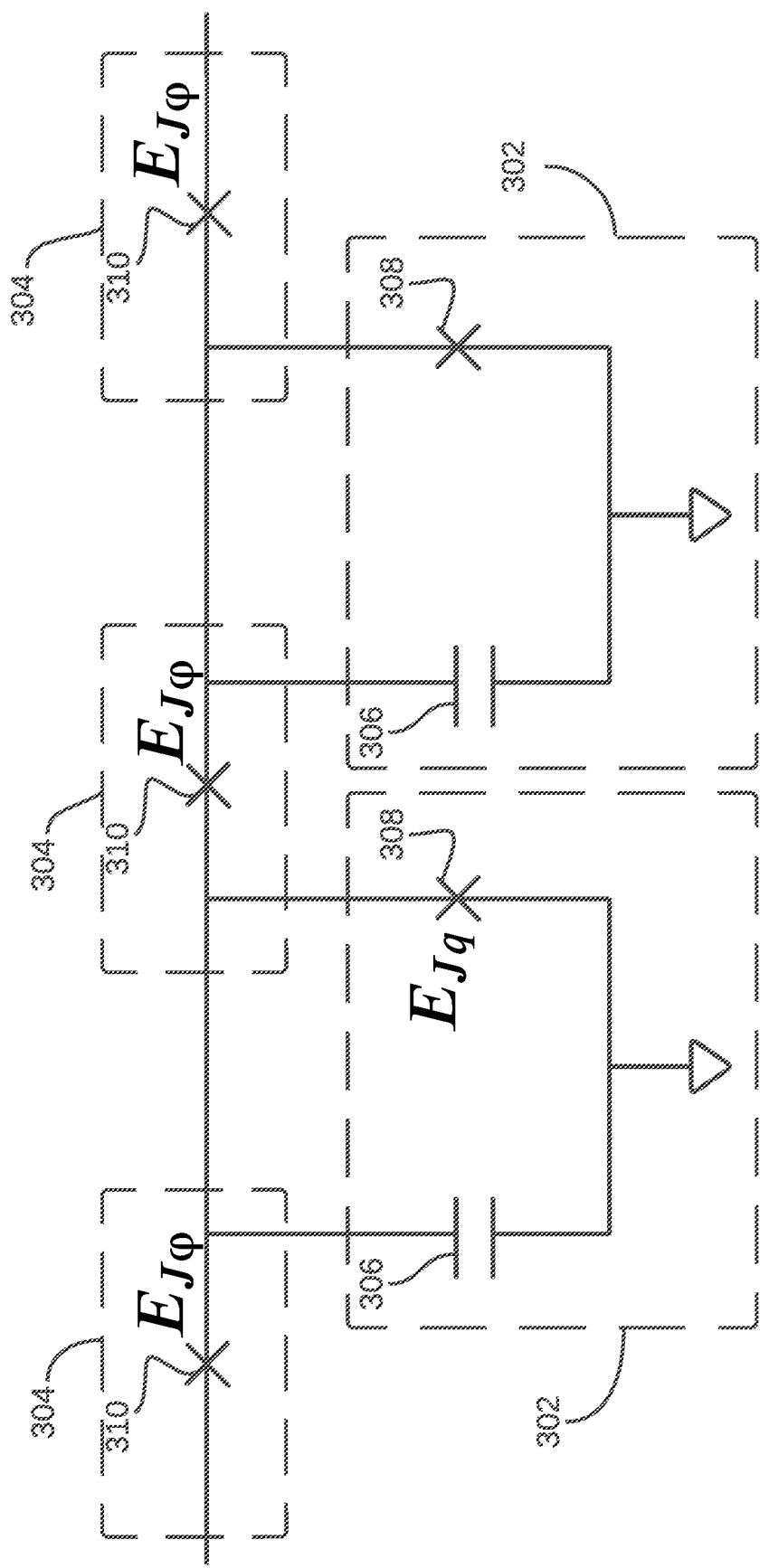
FIGS. 3A-3I are example architectures for the circuit of FIG. 1.

With reference to FIG. 3A, there is illustrated an example embodiment of a topologically protected circuit. In this example, two qubits 302 are coupled to three coupling devices 304. The qubits 302 are of the architecture illustrated in FIG. 2A but other qubit architectures may also be used. Each coupling device 304 is composed of at least one T-Josephson junction 310, where the Josephson phase is non-zero in a ground state. In some embodiments, the at least one φ-Josephson junction is at least one π-Josephson junction, and the Josephson phase is π in the ground state.

A π-Josephson junction can be seen as a Josephson junction with a negative critical current such that the Josephson current-phase relation is written as:

$$I(\phi) = -|I_c|\sin(\phi) = |I_c|\sin(\phi-\pi) \quad (2)$$

In which case, the energy U of the junction can be expressed as:

$$U(\phi) = -\frac{\Phi_0 |I_c|}{2\pi}[1 - \cos(\phi)] = -E_{J\pi}[1 - \cos(\phi)] \quad (3)$$

The (positive) Josephson energy of the junction is defined as $$E_{J\pi} = \frac{\Phi_0 |I_c|}{2\pi},$$

with $\phi_0$ as the magnetic flux quantum. The sign of the cosine term differs when compared with conventional Josephson junctions. As a consequence, the energy is minimum when the phase $\phi=\pi$.

A π-Josephson junction is a special case of a φ-Josephson junction, where the current I and energy U of the junction as a function of phase $\phi$ can be written as:

$$I(\phi) = I_c \sin(\phi - \pi) \quad (4)$$

$$U(\phi) = \frac{\Phi_0 I_c}{2\pi}[1 - \cos(\phi - \varphi_0)] = E_{J\varphi}[1 - \cos(\phi - \varphi_0)] \quad (5)$$

Referring back to the circuit shown in FIG. 3A, the φ-Josephson junctions 310 of coupling devices 304 have a Josephson energy $E_{J\varphi}$, the Josephson junctions 308 of qubits 302 have a Josephson energy of $E_{Jq}$. A superconducting node phase $\phi_i$ and a charge number $n_i$ are assigned to each physical qubit 302, and the Hamiltonian of a chain of N qubits is given by:

$$H = \Sigma_{i=1}^{N}[4E_C n_i^2 - E_{Jq}\cos\phi_i] + \Sigma_{i=1}^{N-1} E_{J\varphi}\cos(\phi_{i+1}-\phi_i-\varphi_0) \quad (6)$$

Here $$E_C = \frac{e^2}{2C}$$

and e is the electron charge. Expanding the cosine terms to a second order Taylor series and dropping the constant terms, the Hamiltonian becomes:

$$H = \sum_{i=1}^{N}\left[4E_C n_i^2 + (E_{Jq} + 2E_{J\varphi}\cos\varphi_0)\frac{\phi_i^2}{2}\right] - \sum_{i=1}^{N-1} E_{J\varphi}(\cos(\varphi_0)\phi_i\phi_{i+1} + \sin(\varphi_0)(\phi_i - \phi_{i+1})) \qquad (7)$$

In the ideal case of a π-Josephson junction ($\varphi_0=\pi$), the above Hamiltonian is simplified to:

$$H = \sum_{i=1}^{N}\left[4E_C n_i^2 + (E_{Jq} - 2E_{J\varphi})\frac{\phi_i^2}{2}\right] + \sum_{i=1}^{N-1} E_{J\varphi}\phi_i\phi_{i+1} \qquad (8)$$

The first term corresponds to the sum of the Hamiltonians of N transmon qubits having an effective Josephson energy equal to $\tilde{E}_J = E_{Jq} + 2E_{J\varphi}\cos\varphi_0$. The second term represents the coupling between nearest neighbors. For a finite chain, the two qubits at the ends of the chain have effective Josephson energies of $\tilde{E}_J = E_{Jq} + E_{J\varphi}\cos\varphi_0$ since they have only one neighbor.

The above Taylor expansion approximation is justified as long as the phases $\phi_i$ remain close to zero, which means that the phase across the coupling devices 304 is also close to zero. In other words, the qubit junctions 308 are in their ground state, but not the coupling device junctions 310. This is indeed the configuration that minimizes energy when $E_{J\varphi} < E_{Jq}/2$ (or equivalently $\tilde{E}_J > 0$), which is the regime of interest. Moreover, the inductive energy in eq. (6) reduces to $N(E_{Jq} - E_{J\varphi})$ if end effects are neglected. In the case where the phase across the couplers is equal to a non-zero φ value, then it means that there is a difference of that non-zero φ value between adjacent qubits. This difference is π when $\varphi_0=\pi$. As a consequence, the inductive energy of the qubits cancels along the chain and the total inductive energy reduces to that of the couplers, i.e. $-NE_{J\varphi}$, which is always higher than the energy for phases of zero as long as $E_{J\varphi} < E_{Jq}/2$.

The effective qubit impedance r and plasma frequency $\omega_p$ may be defined as:

$$r = \sqrt{\frac{8E_c}{\tilde{E}_j}} \text{ and } \omega_p = \frac{\sqrt{8E_c\tilde{E}_j}}{\hbar} \qquad (9)$$

The charge and phase operators may then be written in terms of creation and annihilation operators ($a^\dagger$ and a respectively):

$$n_i = \frac{i}{\sqrt{2r}}(a_i^\dagger - a_i) \qquad (10)$$

$$\phi_i = \sqrt{\frac{r}{2}}(a_i^\dagger + a_i) \qquad (11)$$

Rewriting the Hamiltonian in terms of the creation and annihilation operators gives:

Performing a two-level approximation with Pauli operators, eq. (12) may be rewritten as an Ising Hamiltonian:

$$H = -\Sigma_{i=1}^{N} h\sigma_i^z - \Sigma_{i=1}^{N-1} J\sigma_i^x\sigma_{i+1}^x - \Sigma_{i=1}^{N-1} B_x(\sigma_i^x - \sigma_{i+1}^x) \qquad (13)$$

with:

$$h = \frac{\hbar\omega_p}{2} = \frac{r\tilde{E}_j}{2} \qquad (14)$$

$$J = \frac{r}{2}E_{J\varphi}\cos\varphi_0 \qquad (15)$$

$$B_x = \sqrt{\frac{r}{2}}E_{J\varphi}\sin\varphi_0 \qquad (16)$$

Note that $B_x$ is only a small correction to the Ising model when $\varphi_0 \sim \pi$. In the Ising model, the condition for achieving topological protection is $|J| > |h|$. In the present case, that becomes $E_{J\varphi} > |\tilde{E}_J|$. Note that $E_{J\varphi}$, has been defined as positive, while $\tilde{E}_J$ can be either positive (if $E_{Jq} > -2E_{J\varphi}\cos\varphi_0$) or negative (if $E_{Jq} < -2E_{J\varphi}\cos\varphi_0$). In the case of interest, $\tilde{E}_J$ is positive and the condition for deep strong coupling becomes:

$$\frac{E_{Jq}}{2} > -E_{J\varphi}\cos\varphi_0 > \frac{E_{Jq}}{3} \qquad (17)$$

The above derivation demonstrates that coupling transmon qubits with non-zero Josephson junctions allows to reach deep strong coupling and topological protection as long as the above condition is respected.

Various implementations of the φ-Josephson junction (or π-Josephson junction) may be used, including but not limited to a superconductor-ferromagnet-superconductor architecture, a superconductor with unconventional pairing symmetry (e.g., d-wave superconductors), a superconductor/normal-metal/superconductor junction, a carbon nanotube junction, and a ferromagnetic junction. The coupling devices 102 as described herein may be realized with any type of φ-Josephson junction (or π-Josephson junction) having a non-zero phase in its ground state.

In some embodiments, the φ-Josephson junction (or π-Josephson junction) is designed with specific parameters to ensure that the condition of eq. (17) is always true. In other words, the Josephson energy $E_{J\varphi}$, of the coupling device 304 is hard coded into the φ-Josephson junction at the time of fabrication. In this case, no external control signal is needed to operate the circuit.

Figure 3B:
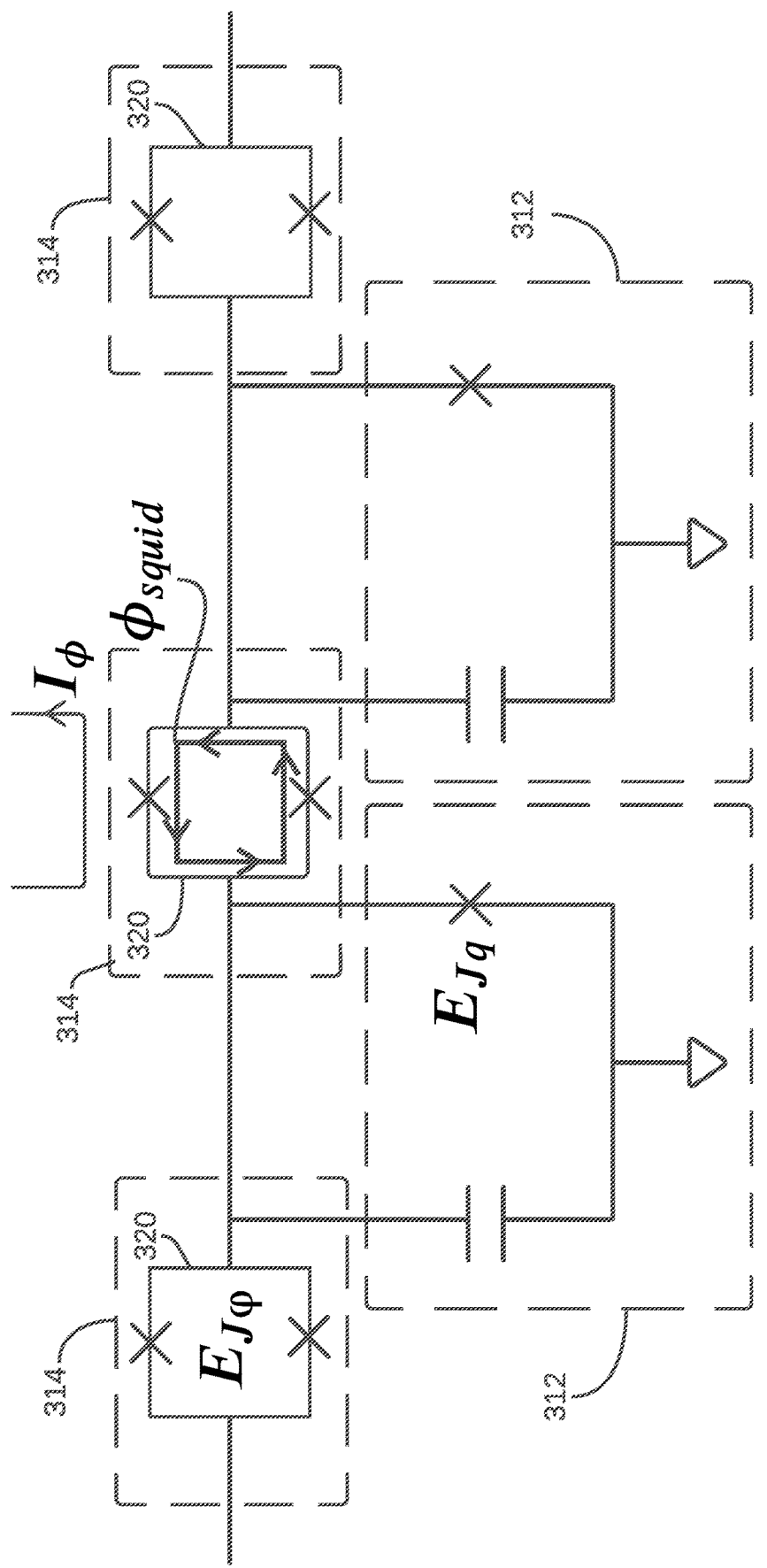

In some embodiments, the φ-Josephson junction (or π-Josephson junction) effective Josephson energy can be tuned with a gating voltage or magnetic field. For example, in $$H = \sum_{i=1}^{N} \hbar\omega_p\left(a_i^\dagger a_i + \frac{1}{2}\right) - \sum_{i=1}^{N-1} \frac{E_{J\varphi}\cos\varphi_0 r}{2}(a_i^\dagger + a_i)(a_{i+1}^\dagger + a_{i+1}) - \sum_{i=1}^{N-1} \sqrt{\frac{r}{2}}E_{J\varphi}\sin\varphi_0(a_i^\dagger + a_i) \qquad (12)$$

some embodiments, the Josephson energy $E_{J\varphi}$, of the coupling device is flux-tunable and is induced by applying an external flux $\varphi_{SQUID}$ to a superconducting loop of the coupling devices 314. An example embodiment is shown in FIG. 3B, where the coupling device 314 is composed of a φ-SQUID 320 having two φ-Josephson junctions connected in parallel. Current $I_\varphi$ causes the flux to be threaded in the φ-SQUID loop. The coupling energy of the circuit may then be tuned to meet the condition (17) to provide topological protection to the circuit. Note that the effective Josephson energy of φ-SQUID 320 may also be reduced to zero to completely decouple the qubits 312 from each other.

Figure 3C:
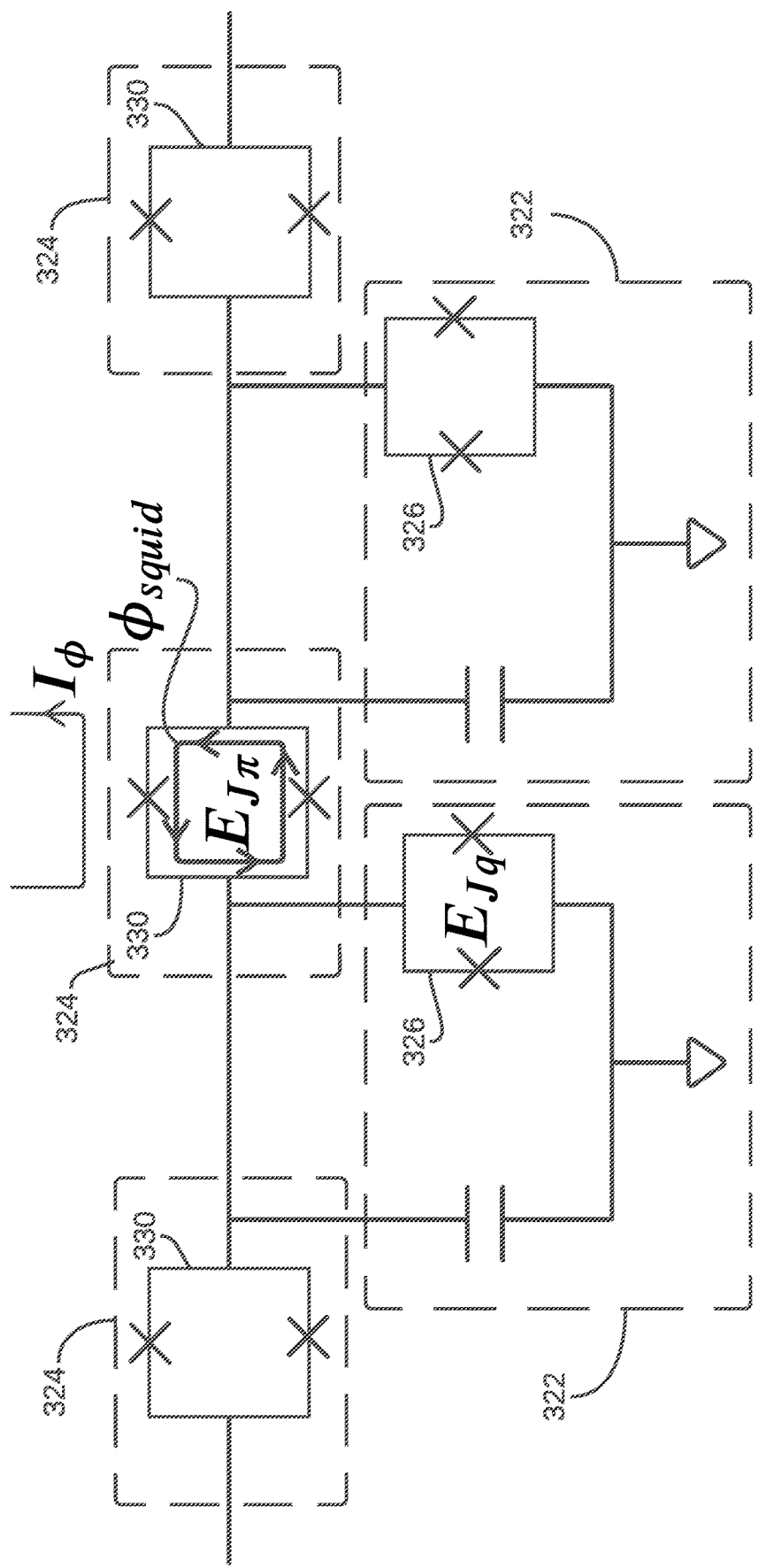

FIG. 3C shows another embodiment for the topologically protected circuit, whereby additional tunability is provided by replacing the Josephson junction of the qubits with SQUIDS. Qubits 322 are provided with SQUIDS 326 to allow further flexibility in meeting the condition of eq. (17) as $E_{Jq}$ is now also tunable. Coupling devices 324 also comprise a π-SQUID 330, such that the Josephson energy of the π-SQUID 330 is $E_{J\pi}$.

Figure 3D:
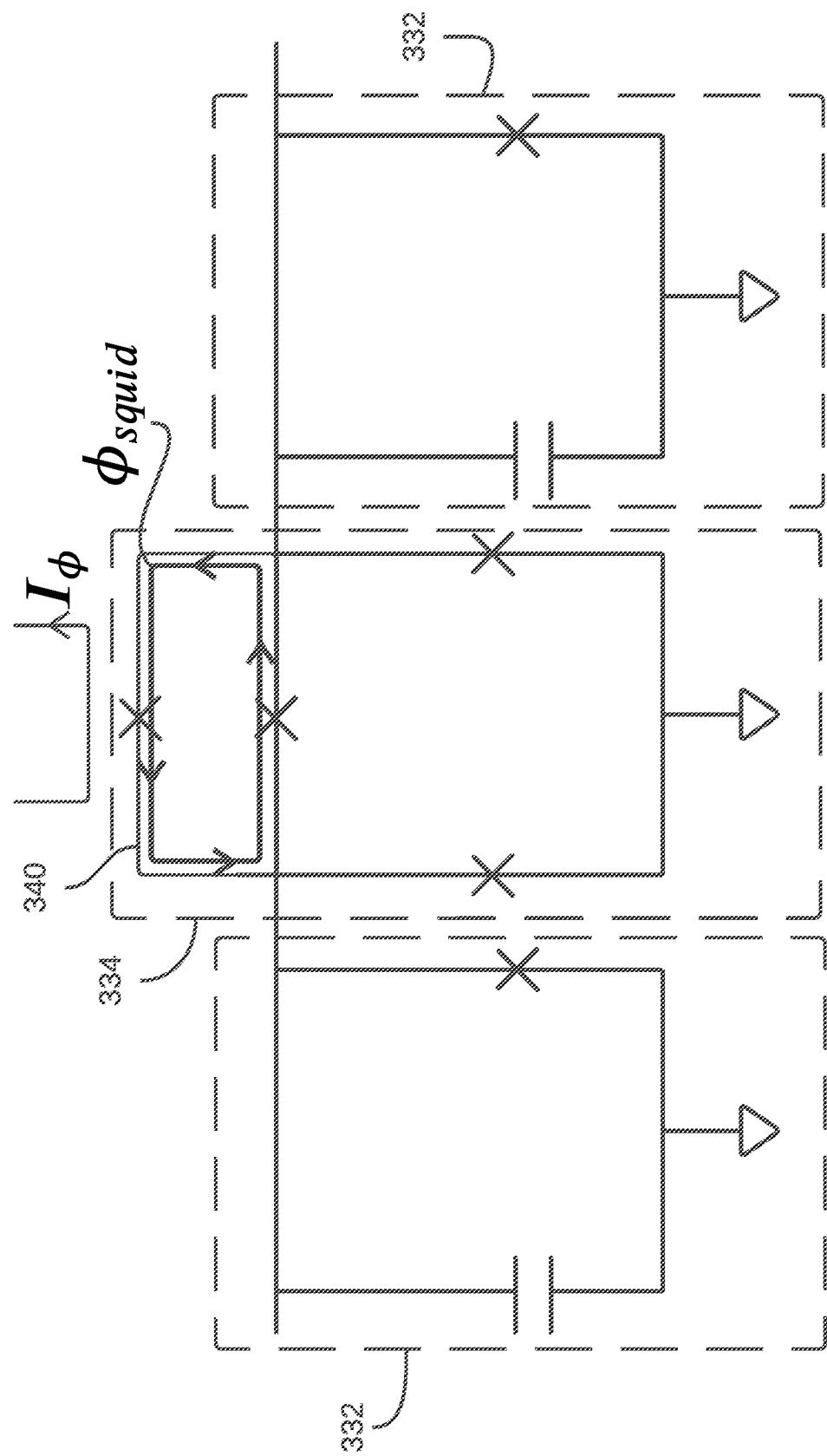
Figure 3E:
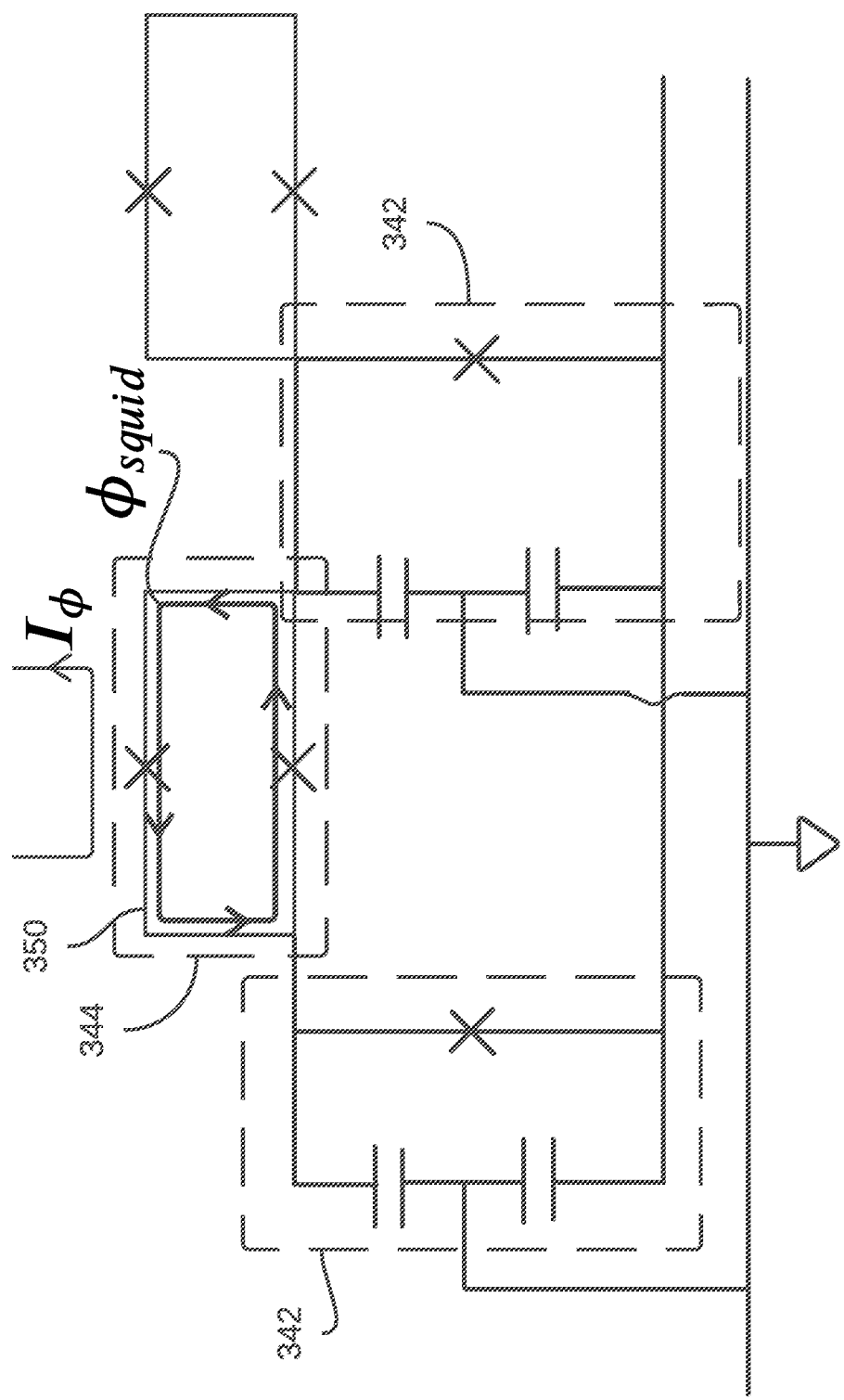
Figure 3F:
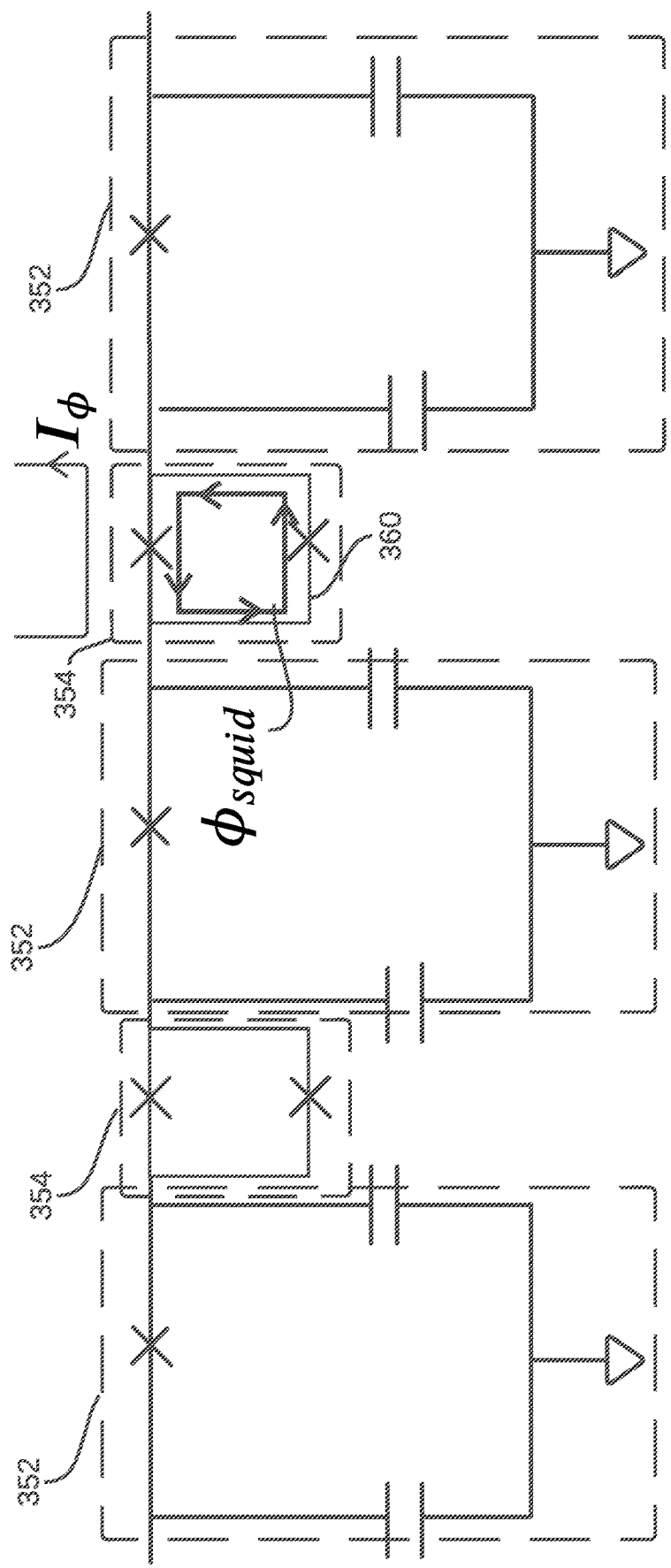
Figure 3G:
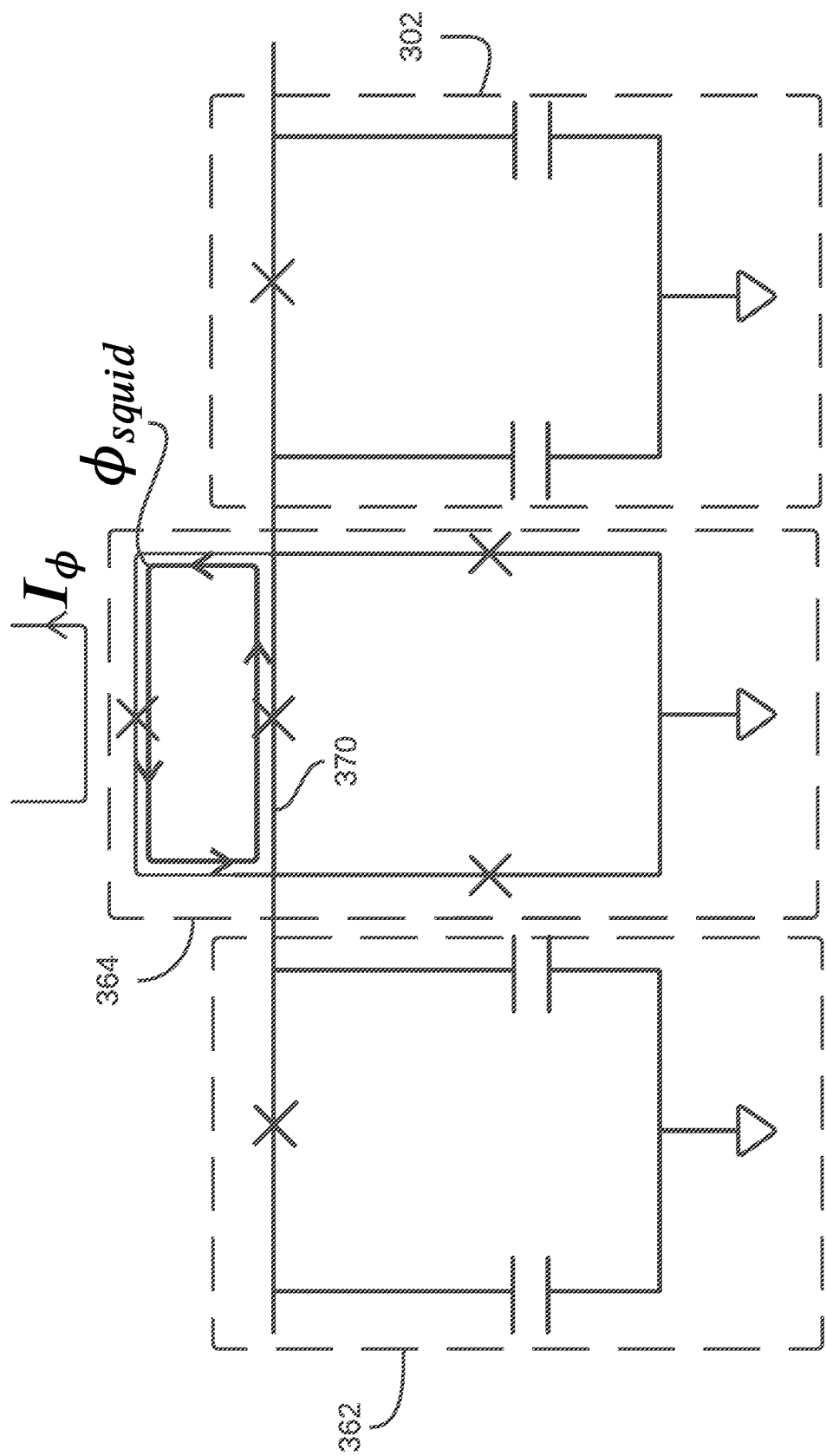
Figure 3H:
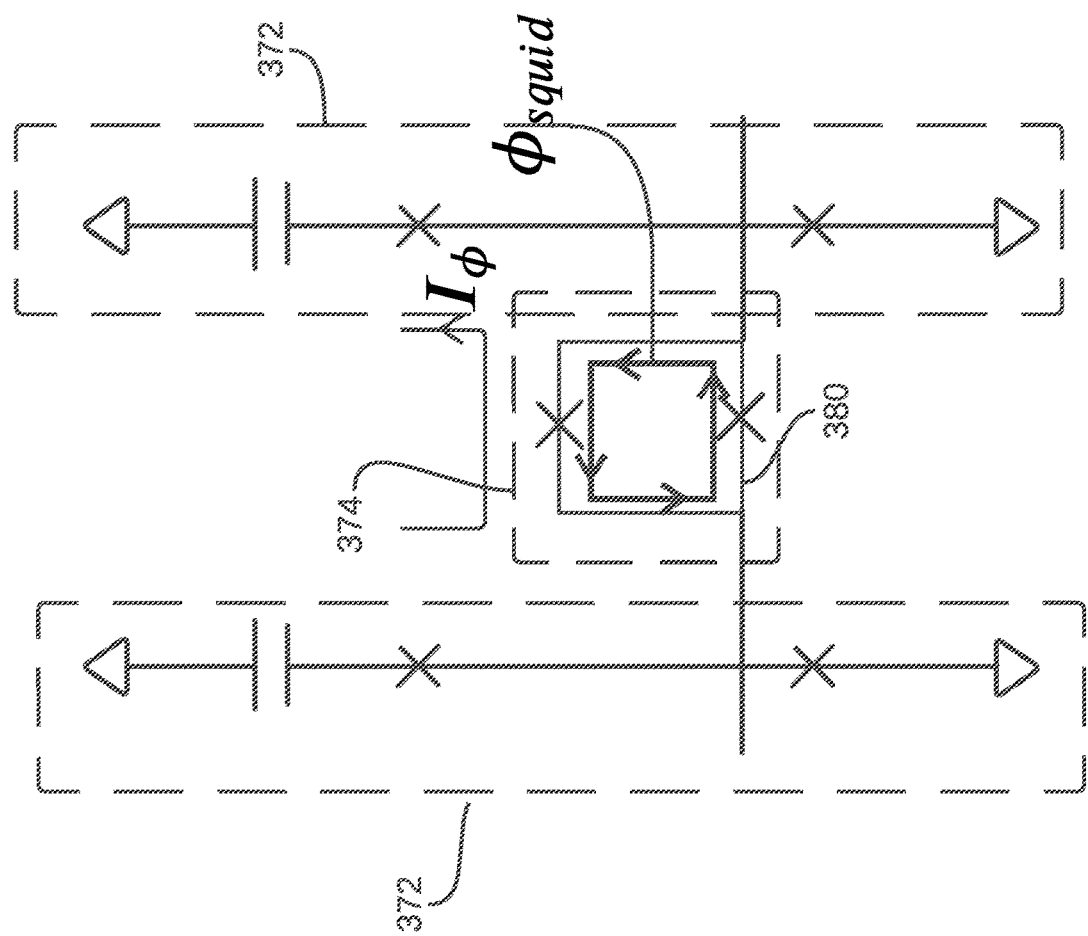
Figure 3I:
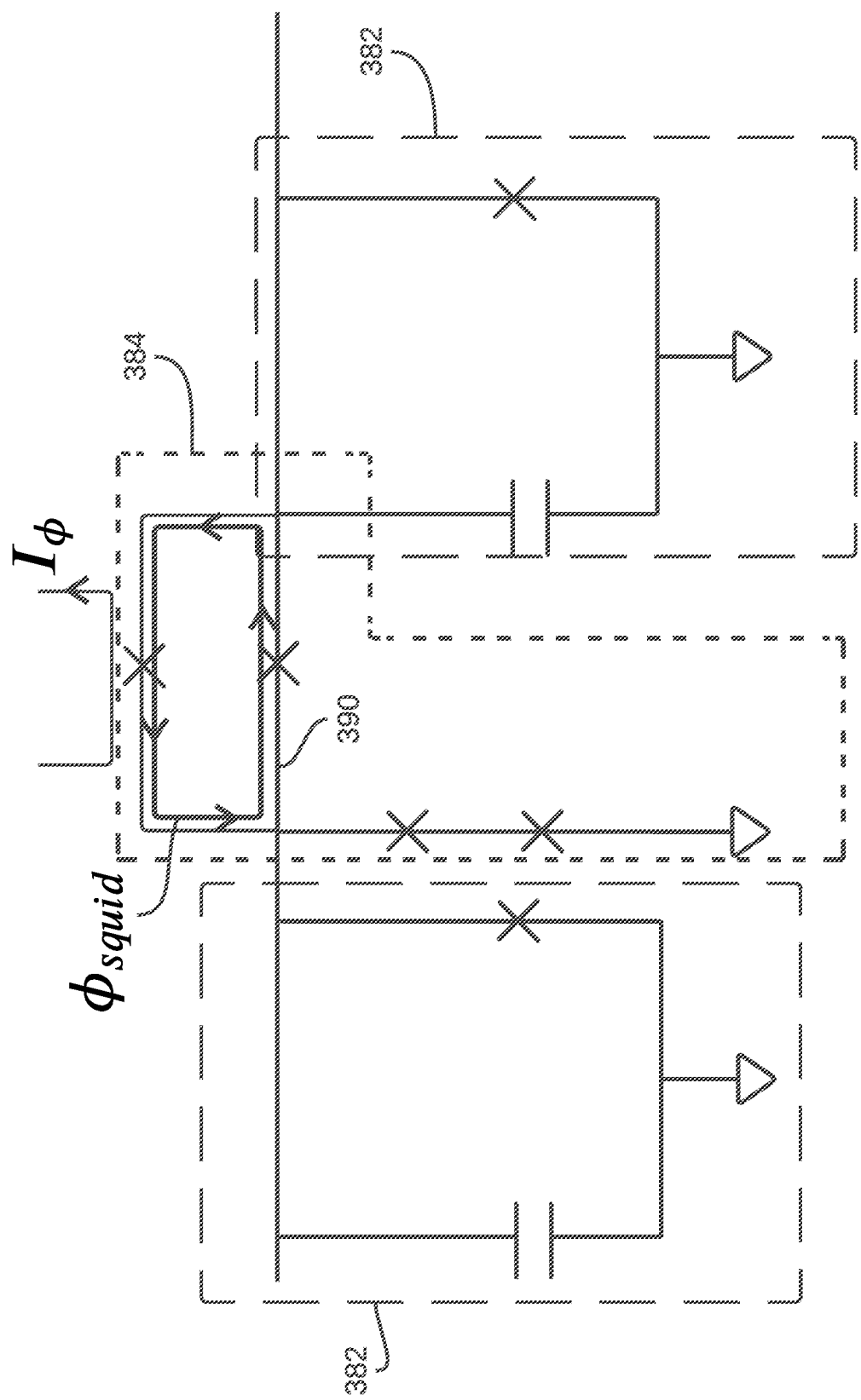

FIG. 3D illustrates another architecture for the topologically protected circuit. Qubits 332 are coupled with coupling device 334. A flux $\varphi_{SQUID}$ is induced in the φ or π-SQUID 340 from the current $I_\varphi$. In FIG. 3E, qubits 342 are coupled with coupling device 344. A flux $\varphi_{SQUID}$ is induced in the φ or π-SQUID 350 from the current $I_\varphi$. In FIG. 3F, qubits 352 are coupled with coupling device 354. A flux $\varphi_{SQUID}$ is induced in the φ or π-SQUID 360 from the current $I_\varphi$. In FIG. 3G, qubits 362 are coupled with coupling device 364. A flux $\varphi_{SQUID}$ is induced in the φ or π-SQUID 370 from the current $I_\varphi$. In FIG. 3H, qubits 372 are coupled with coupling device 374. A flux $\varphi_{SQUID}$ is induced in the φ or π-SQUID 380 from the current $I_\varphi$. In FIG. 3I, qubits 382 are coupled with coupling device 384. A flux $\varphi_{SQUID}$ is induced in the φ or π-SQUID 390 from the current $I_\varphi$. It will be understood that the φ or π-SQUIDs 340, 350, 360, 370, 380, 390 may all be replaced with a single φ or π-Josephson junction having a designed Josephson energy that is set to meet the condition of eq. (17) in order to provide topological protection to the circuit. It will also be understood that any Josephson junction in qubits 332, 342, 352, 362, 372, 382 may be replaced with a SQUID for added tunability of the circuit.

The term "connected" or "coupled to" may include both direct coupling (in which two elements that are coupled to each other contact each other) and indirect coupling (in which at least one additional element is located between the two elements).

Although the embodiments have been described in detail, it should be understood that various changes, substitutions, and alterations can be made herein without departing from the scope. Moreover, the scope of the present application is not intended to be limited to the particular embodiments of the process, machine, manufacture, composition of matter, means, methods and steps described in the specification.

As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

As can be understood, the examples described above and illustrated are intended to be exemplary only.

The invention claimed is:

1. A topological superconducting qubit circuit comprising:
a plurality of physical superconducting qubits; and
a plurality of coupling devices interleaved between pairs of the physical superconducting qubits, the coupling devices comprising at least one φ-Josephson junction, wherein a Josephson phase $\varphi_0$ of the φ-Josephson junction is non-zero in a ground state, the coupling devices having a Josephson energy $E_{J\varphi}$, the physical superconducting qubits having a Josephson energy $E_{Jq}$, the circuit operating in a topological regime when $$\frac{E_{Jq}}{2} > -E_{J\varphi}\cos\varphi_0 > \frac{E_{Jq}}{3}.$$

2. The topological superconducting qubit circuit of claim 1, wherein the at least one φ-Josephson Junction is at least one π-Josephson junction, and the Josephson phase $\varphi_0=\pi$ in the ground state.

3. The topological superconducting qubit circuit of claim 2, wherein the at least one π-Josephson junction comprises a pair of π-Josephson junctions connected in parallel to form a π-SQUID.

4. The topological superconducting qubit circuit of claim 1, wherein the coupling devices are flux-tunable to take the circuit in and out of the topological regime.

5. The topological superconducting qubit circuit of claim 1, wherein the physical superconducting qubits are transmons.

6. The topological superconducting qubit circuit of claim 1, wherein the physical superconducting qubits comprise a capacitor and at least one Josephson junction.

7. The topological superconducting qubit circuit of claim 6, wherein the at least one Josephson junction forms part of a SQUID.

8. The topological superconducting qubit circuit of claim 1, wherein the physical superconducting qubits comprise a differential architecture.

9. The topological superconducting qubit circuit of claim 1, wherein the physical superconducting qubits comprise a two-junction architecture.

10. The topological superconducting qubit circuit of claim 1, wherein the physical superconducting qubits comprise an inductively shunted architecture.

11. A method for operating a topological superconducting qubit circuit, the method comprising:
interleaving a plurality of coupling devices with a plurality of physical superconducting qubits, the coupling devices comprising at least one φ-Josephson junction, wherein a Josephson phase $\varphi_0$ of the φ-Josephson junction is non-zero in a ground state; and
providing the coupling devices with a Josephson energy $E_{J\varphi}$ and the physical superconducting qubits with a Josephson energy $E_{Jq}$, such that $$\frac{E_{Jq}}{2} > -E_{J\varphi}\cos\varphi_0 > \frac{E_{Jq}}{3}$$

to induce topological protection of the circuit.

12. The method of claim 11, wherein the at least one φ-Josephson junction is at least one π-Josephson junction, and the Josephson phase $\varphi_0=\pi$ in the ground state.

13. The method of claim 12, wherein the at least one π-Josephson junction comprises a pair of π-Josephson junctions connected in parallel to form a π-SQUID.

14. The method of claim 11, wherein providing the coupling devices with the Josephson energy $E_{J\varphi}$ comprises applying an external flux $\varphi_{SQUID}$ to a superconducting loop of the coupling devices.

15. The method of claim 11, wherein the physical superconducting qubits are transmons.

16. The method of claim 11, wherein the physical superconducting qubits comprise a capacitor and at least one Josephson junction.

17. The method of claim 16, wherein the at least one Josephson junction forms part of a SQUID.

18. The method of claim 11, wherein the physical superconducting qubits comprise a differential architecture.

19. The method of claim 11, wherein the physical superconducting qubits comprise a two-junction architecture.

20. The method of claim 11, wherein the physical superconducting qubits comprise an inductively shunted architecture.

\* \* \* \* \*